(12) United States Patent
Kuniyoshi

(10) Patent No.: US 9,239,484 B2
(45) Date of Patent: Jan. 19, 2016

(54) DISPLAY DEVICE SUBSTRATE AND METHOD FOR FABRICATING SAME, AND DISPLAY DEVICE

(75) Inventor: Tokuaki Kuniyoshi, Osaka (JP)

(73) Assignee: SHARP KABUSHIKI KAISHA, Osaka (JP)

(*) Notice: Subject to any disclaimer, the term of this patent is extended or adjusted under 35 U.S.C. 154(b) by 328 days.

(21) Appl. No.: 13/884,356

(22) PCT Filed: Nov. 2, 2011

(86) PCT No.: PCT/JP2011/006134
§ 371 (c)(1),
(2), (4) Date: Aug. 28, 2013

(87) PCT Pub. No.: WO2012/063436
PCT Pub. Date: May 18, 2012

(65) Prior Publication Data
US 2013/0329176 A1    Dec. 12, 2013

(30) Foreign Application Priority Data
Nov. 10, 2010   (JP) ................. 2010-252137

(51) Int. Cl.
| G02F 1/1362 | (2006.01) |
| G02F 1/1333 | (2006.01) |
| G02F 1/1368 | (2006.01) |

(Continued)

(52) U.S. Cl.
CPC ........ *G02F 1/133345* (2013.01); *G02F 1/1368* (2013.01); *G02F 1/136209* (2013.01); *H01L 29/66765* (2013.01); *H01L 29/7869* (2013.01); *H01L 29/78633* (2013.01); *H01L 29/78669* (2013.01); *G02F 2001/136231* (2013.01); *G02F 2201/34* (2013.01); *G02F 2203/02* (2013.01); *G02F 2203/055* (2013.01)

(58) Field of Classification Search
CPC ............ G02F 1/136209; G02F 1/1368; H01L 29/66765; H01L 29/78633; H01L 29/78669
See application file for complete search history.

(56) References Cited

U.S. PATENT DOCUMENTS

| 8,999,823 B2 * | 4/2015 | Makita et al. ................. 438/487 |
| 2005/0048706 A1 | 3/2005 | Shimomura et al. |
| 2011/0198608 A1 * | 8/2011 | Yamanaka ............ G02F 1/1368 257/72 |

FOREIGN PATENT DOCUMENTS

| JP | 55-027778 A | 2/1980 |
| JP | 64-033531 A | 2/1989 |
| JP | 10-186402 A | 7/1998 |

(Continued)

OTHER PUBLICATIONS

Official Communication issued in International Patent Application No. PCT/JP2011/006134, mailed on Dec. 20, 2011.

*Primary Examiner* — Richard Kim
*Assistant Examiner* — Kendrick Hsu
(74) *Attorney, Agent, or Firm* — Keating & Bennett, LLP

(57) ABSTRACT

A thin film transistor substrate (20*a*) includes an insulating substrate (10*a*), a semiconductor layer (13*a*) provided on the insulating substrate (10*a*) and having a channel region (C), and a channel protection layer (25) provided in the channel region (C). The channel protection layer (25) is made of a multilayer film in which first insulating films and second insulating films are alternately layered. A relationship between a refractive index Ra of the first insulating film and a refractive index Rb of the second insulating film is Rb/Ra≥1.3.

7 Claims, 11 Drawing Sheets

(51) Int. Cl.
*H01L 29/66* (2006.01)
*H01L 29/786* (2006.01)

(56) References Cited

FOREIGN PATENT DOCUMENTS

| JP | 2002-267815 A | 9/2002 |
| JP | 2004-179450 A | 6/2004 |
| JP | 2005-101553 A | 4/2005 |
| JP | 2008-085091 A | 4/2008 |
| JP | WO 2010050161 A1 * | 5/2010 | ............ G02F 1/1368 |
| JP | 2010-237419 A | 10/2010 |
| JP | 2012-073487 A | 4/2012 |
| KR | 10-2006-0071022 A | 6/2006 |
| WO | WO 2010047086 A1 * | 4/2010 |

* cited by examiner (a)

(b)

(c)

DISPLAY DEVICE SUBSTRATE AND METHOD FOR FABRICATING SAME, AND DISPLAY DEVICE

TECHNICAL FIELD

The present disclosure relates to display device substrates and methods for fabricating the display device substrates, and display devices.

BACKGROUND ART

A thin film transistor (hereinafter also referred to as "TFT") as a switching element, for example, is provided on a thin film transistor substrate for each pixel which is a minimum unit of an image.

Further, in general, a thin film transistor using a semiconductor layer made of amorphous silicon is used in a thin film transistor substrate, as a switching element of each pixel which is a minimum unit of an image.

A general TFT having a bottom gate structure includes, for example, a gate electrode provided on an insulating substrate, a gate insulating film provided so as to cover the gate electrode, an island-shaped semiconductor layer located on the gate insulating film so as to overlap the gate electrode, and a source electrode and a drain electrode facing each other on the semiconductor layer.

In the TFT having the bottom gate structure, an upper portion of a channel region is covered by an interlayer insulating film made of $SiO_2$, etc., and a pixel electrode is provided on the interlayer insulating film to fabricate a thin film transistor substrate. A counter substrate is provided so as to face the thin film transistor substrate, and a liquid crystal layer is provided between the thin film transistor substrate and the counter substrate, thereby forming a liquid crystal display device.

In a conventional TFT structure, the semiconductor layer is located above the gate electrode, and therefore the gate electrode serves as a light shielding film. However, in the liquid crystal display device, a display region is irradiated with light of a backlight unit from the thin film transistor substrate side. Thus, once the light coming through a portion other than the light shielding film reflects on the counter substrate, etc., and comes into the semiconductor layer from above the TFT, the channel region of the semiconductor layer made of amorphous silicon is irradiated with the light due to lack of the light shielding film. As a result, because of the photoexcitation, a leakage current may be present when the TFT is off, or the amorphous silicon may be degraded by the light. This may result in a reduction in TFT properties and display quality of the liquid crystal display device.

Thin film transistor substrates configured to avoid such a disadvantage have been suggested. More specifically, in a thin film transistor substrate in which a TFT is located near an intersection between a gate line and a source line and in which the TFT and a pixel electrode are connected to each other, a metal layer for blocking light is provided above a channel region of the TFT via an insulating film (see, e.g., Patent Document 1).

CITATION LIST

Patent Document

Patent Document 1: Japanese Patent Publication No. H10-186402

SUMMARY OF THE INVENTION

Technical Problem

In the thin film transistor substrate shown in Patent Document 1, the metal layer for blocking light is made of a conductive metal material (a metal material that forms a source electrode and a drain electrode). Therefore, TFT properties may be adversely affected, depending on a distance between the channel region of the semiconductor layer and the metal layer.

More specifically, for example, if there is a conductive metal layer provided above a channel region, the metal layer functions as a parasitic capacitance when a voltage is applied to the gate electrode to turn on the TFT. If the distance between the channel region and the metal layer is small, the operation of the TFT may be adversely affected because, for example, when the TFT is turned off by reversing a gate voltage, the channel region of the semiconductor layer is not promptly turned from on to off due to electric charges of the charged metal layer.

The present disclosure is thus intended to provide a display device substrate which can effectively reduce light irradiation of a channel region without affecting TFT properties, a method for fabricating the display device substrate, and a display device.

Solution to the Problem

To achieve the above objective, the first display device substrate according to the present disclosure includes: an insulating substrate; a semiconductor layer provided on the insulating substrate and having a channel region; and a channel protection layer provided in the channel region, wherein the channel protection layer is made of a multilayer film in which first insulating films and second insulating films are alternately layered, and a relationship between a refractive index Ra of the first insulating film and a refractive index Rb of the second insulating film is $Rb/Ra \geq 1.3$.

According to this configuration, the channel protection layer is made of a multilayer film in which first insulating films and second insulating films are alternately layered, and a relationship between the refractive index Ra of the first insulating film and the refractive index Rb of the second insulating film is $Rb/Ra \geq 1.3$. Thus, if the semiconductor layer is a semiconductor layer of a thin film transistor, light having a specific wavelength (in particular, light having a short wavelength of 600 nm or less which induces degradation of the thin film transistor) can be effectively reflected, and it is possible to prevent light having a specific wavelength which induces degradation of the semiconductor layer from coming into the channel region of the semiconductor layer. As a result, it is possible to effectively prevent a reduction in properties of the thin film transistor due to light irradiation of the channel region of the semiconductor layer.

Further, since the channel protection layer is made of a multilayer film in which the first and second insulating films are layered, properties of the thin film transistor are not affected by the channel protection layer, and it is possible to effectively reduce light irradiation of the channel region, unlike the conventional technique in which a light blocking metal layer made of a conductive metal material is provided for blocking light.

In the present embodiment, the channel protection layer is made of a multilayer film in which the first and second insulating films are layered, and therefore, in forming the multilayer film in which the first and second insulating films are layered by sequentially forming a silicon nitride film and a silicon oxide film, by, for example, plasma CVD, the channel protection layer can be formed by only changing source gas in a plasma apparatus. This means that unlike the case of the light blocking metal layer made of a conductive metal material, steps such as forming a metal film, patterning a resist by photolithography using a photomask, wet etching the metal film, performing resist removal and cleaning, etc., are not necessary, and the number of steps can be reduced. As a result, it is possible to reduce an increase in fabrication cost and a reduction in yields.

In the first display device substrate of the present disclosure, the number of layers included in the multilayer film may be five or more. According to this configuration, light having a specific wavelength which induces degradation of the semiconductor layer can be reliably reflected.

The second display device substrate according to the present disclosure includes: an insulating substrate; a semiconductor layer provided on the insulating substrate and having a channel region; and a channel protection layer provided in the channel region and made of an insulating material, wherein a fine projection/recess structure including recesses and projections is formed in a surface of the channel protection layer which faces opposite the semiconductor layer.

According to this configuration, a fine projection/recess structure including recesses and projections is formed in a surface of the channel protection layer which faces opposite the semiconductor layer. Thus, in the case where the semiconductor layer is a semiconductor layer of a thin film transistor, light having a specific wavelength (in particular, light having a short wavelength of 600 nm or less which induces degradation of the thin film transistor) can be effectively reflected, and it is possible to prevent light having a specific wavelength which induces degradation of the semiconductor layer from coming into the channel region of the semiconductor layer. As a result, it is possible to effectively prevent a reduction in properties of the thin film transistor due to light irradiation of the channel region of the semiconductor layer.

Further, since the channel protection layer is made of an insulating material, the properties of the thin film transistor are not affected by the channel protection layer, and it is possible to effectively reduce light irradiation of the channel region, unlike the conventional technique in which a metal layer made of a conductive metal material is provided for blocking light.

In the second display device substrate of the present disclosure, a distance between adjacent ones of the projections or adjacent ones of the recesses of the projection/recess structure is 380 nm or less.

According to this configuration, the channel protection layer can reflect light over a wide wavelength range of a visible light range (from 360 nm to 760 nm).

In the second display device substrate of the present disclosure, a height of the projection or a depth of the recess is 760 nm or more.

According to this configuration, the channel protection layer can reflect light over a wide wavelength range of a visible light range (from 360 nm to 760 nm).

In the display device substrate according to the present disclosure, the semiconductor layer may be a semiconductor layer of a thin film transistor.

In the display device substrate of the present disclosure, the semiconductor layer may form an optical sensor.

The display device substrate of the present disclosure has a superior characteristic that it is possible to effectively reduce light irradiation of the channel region without causing any adverse effect on the properties of the thin film transistor or the optical sensor. Thus, the present disclosure can be advantageously used for a display device including: a display device substrate; a second display device substrate located to face the display device substrate; and a display medium layer provided between the display device substrate and the second display device substrate. Further, the display device of the present disclosure can be advantageously used as a display device in which the display medium layer is a liquid crystal layer.

A first method for fabricating the display device substrate according to the present disclosure includes: a semiconductor layer formation step in which a semiconductor layer having a channel region is formed on an insulating substrate; and a channel protection layer formation step in which a channel protection layer is formed in the channel region, the channel protection layer being made of a multilayer film in which first insulating films and second insulating films are alternately layered, and a relationship between a refractive index Ra of the first insulating film and a refractive index Rb of the second insulating film being $Rb/Ra \geq 1.3$.

According to this configuration, a channel protection layer made of a multilayer film in which first insulating films and second insulating films are alternately layered, wherein a relationship between the refractive index Ra of the first insulating film and the refractive index Rb of the second insulating film is $Rb/Ra \geq 1.3$, is formed in the channel region of the semiconductor layer. Thus, in the case where the semiconductor layer is a semiconductor layer of a thin film transistor, light having a specific wavelength (in particular, light having a short wavelength of 600 nm or less which induces degradation of the thin film transistor) can be effectively reflected, and it is possible to prevent light having a specific wavelength which induces degradation of the semiconductor layer from coming into the channel region of the semiconductor layer. As a result, it is possible to provide a display device substrate in which it is possible to effectively prevent a reduction in properties of the thin film transistor due to light irradiation of the channel region of the semiconductor layer.

Further, since the channel protection layer is made of a multilayer film in which first and second insulating films are layered, it is possible to provide a display device substrate in which properties of the thin film transistor are not affected by the channel protection layer, and it is possible to effectively reduce light irradiation of the channel region, unlike the conventional technique in which a metal layer made of a conductive metal material is provided for blocking light.

Further, in the present embodiment, the channel protection layer is made of a multilayer film in which the first and second insulating films are layered, and therefore, in forming the multilayer film in which the first and second insulating films are layered by sequentially forming a silicon nitride film and a silicon oxide film, by, for example, plasma CVD, the channel protection layer can be formed by only changing source gas in a plasma apparatus. This means that unlike the case of the light blocking metal layer made of a conductive metal material, steps such as forming a metal film, patterning a resist by photolithography using a photomask, wet etching the metal film, performing resist removal and cleaning, etc., are not necessary, and the number of steps can be reduced. As a result, it is possible to provide a display device substrate which makes it possible to reduce an increase in fabrication cost and a reduction in yields.

A second method for fabricating the display device substrate according to the present disclosure includes: a semiconductor layer formation step in which a semiconductor layer having a channel region is formed on an insulating substrate; and a channel protection layer formation step in which a channel protection layer is formed in the channel region, the channel protection layer being made of an insulating material and having a fine projection/recess structure including a recess and a projection on a surface which faces opposite the semiconductor layer.

According to this configuration, a channel protection layer having a fine projection/recess structure formed in a surface facing opposite the semiconductor layer and including recesses and projections, is formed in the channel region of the semiconductor layer. Thus, in the case where the semiconductor layer is a semiconductor layer of a thin film transistor, light having a specific wavelength (in particular, light having a short wavelength of 600 nm or less which induces degradation of the thin film transistor) can be effectively reflected, and it is possible to prevent light having a specific wavelength which induces degradation of the semiconductor layer from coming into the channel region of the semiconductor layer. As a result, it is possible to provide a display device substrate which makes it possible to effectively prevent a reduction in properties of the thin film transistor due to light irradiation of the channel region of the semiconductor layer.

Further, since the channel protection layer is made of an insulating material, it is possible to provide a display device substrate in which properties of the thin film transistor are not affected by the channel protection layer, and it is possible to effectively reduce light irradiation of the channel region, unlike the conventional technique in which a metal layer made of a conductive metal material is provided for blocking light.

Advantages of the Invention

According to the present disclosure, light irradiation of a channel region can be effectively reduced without affecting TFT properties.

DESCRIPTION OF EMBODIMENTS (First Embodiment)

Embodiments of the present disclosure will be described in detail below with reference to the drawings. The present disclosure is not limited to the embodiments below.

Figure 1:
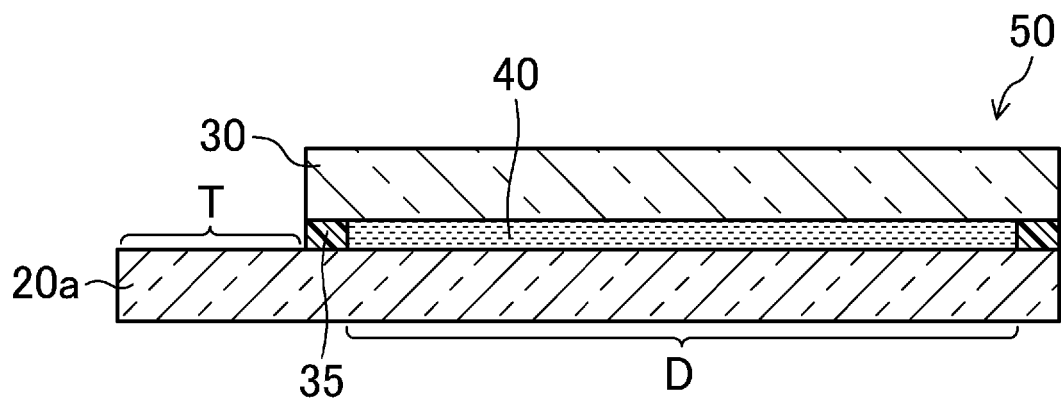
FIG. 1 is a cross-sectional view of a liquid crystal display device having a thin film transistor substrate according to the first embodiment of the present disclosure.
Figure 2:
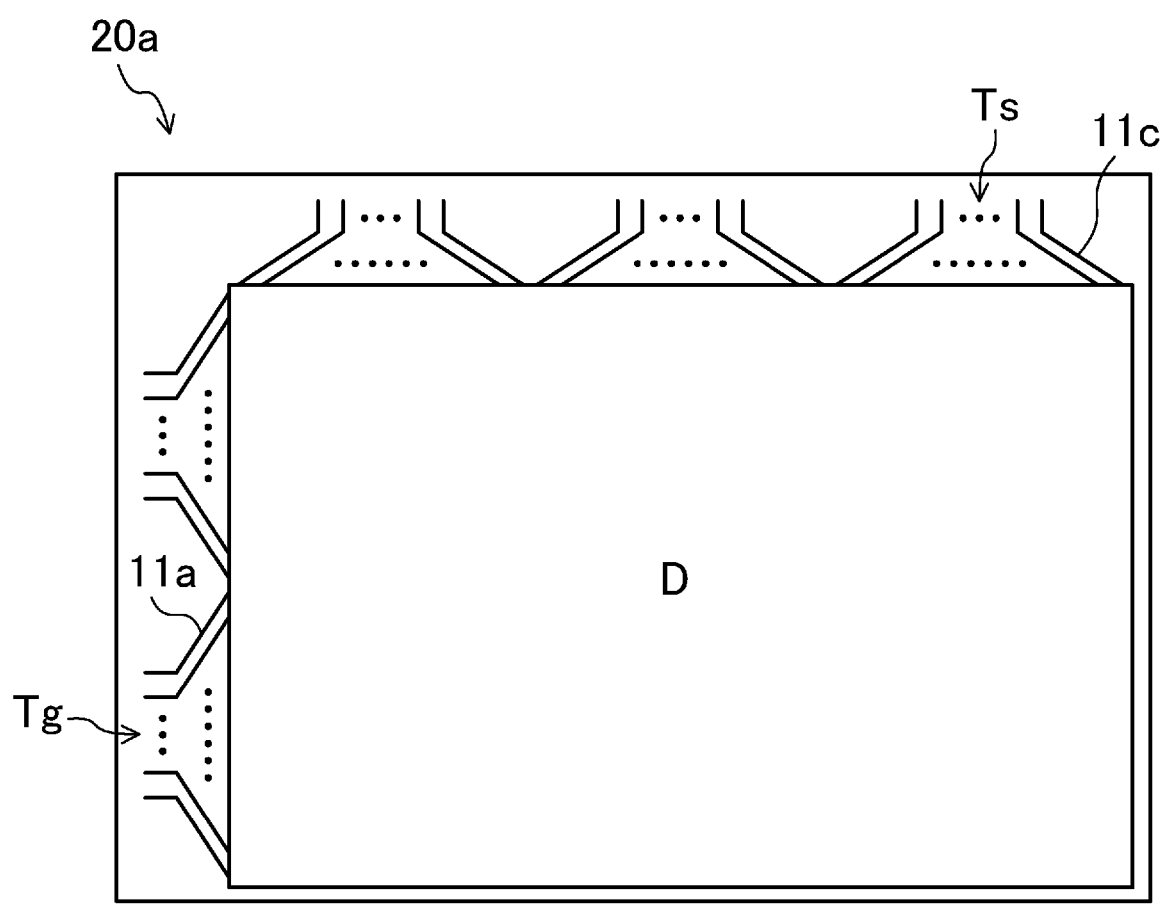
FIG. 2 is a plan view of the thin film transistor substrate according to the first embodiment of the present disclosure.
Figure 3:
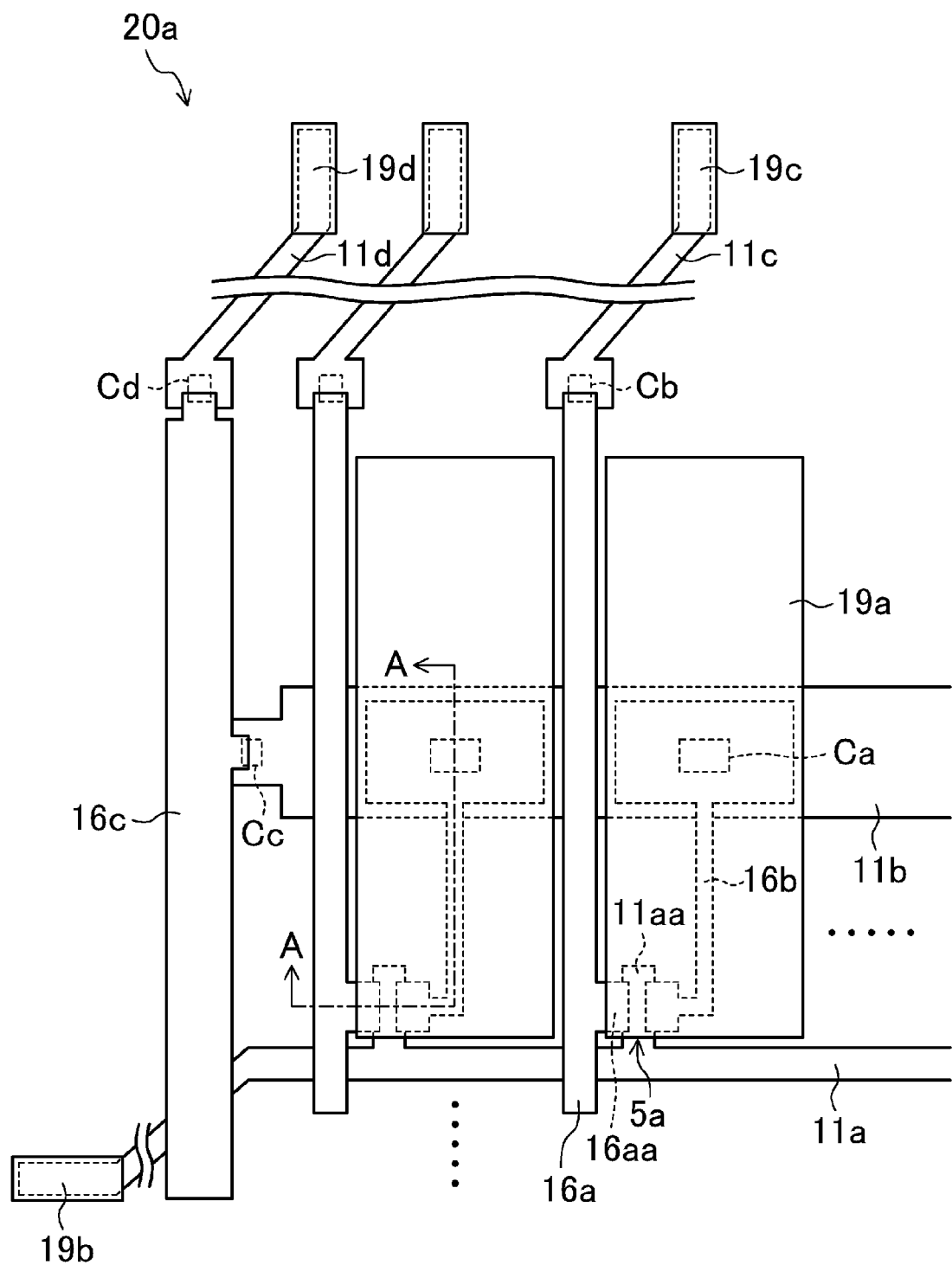
FIG. 3 is an enlarged plan view of a pixel portion and a terminal portion of the thin film transistor substrate according to the first embodiment of the present disclosure.
Figure 4:
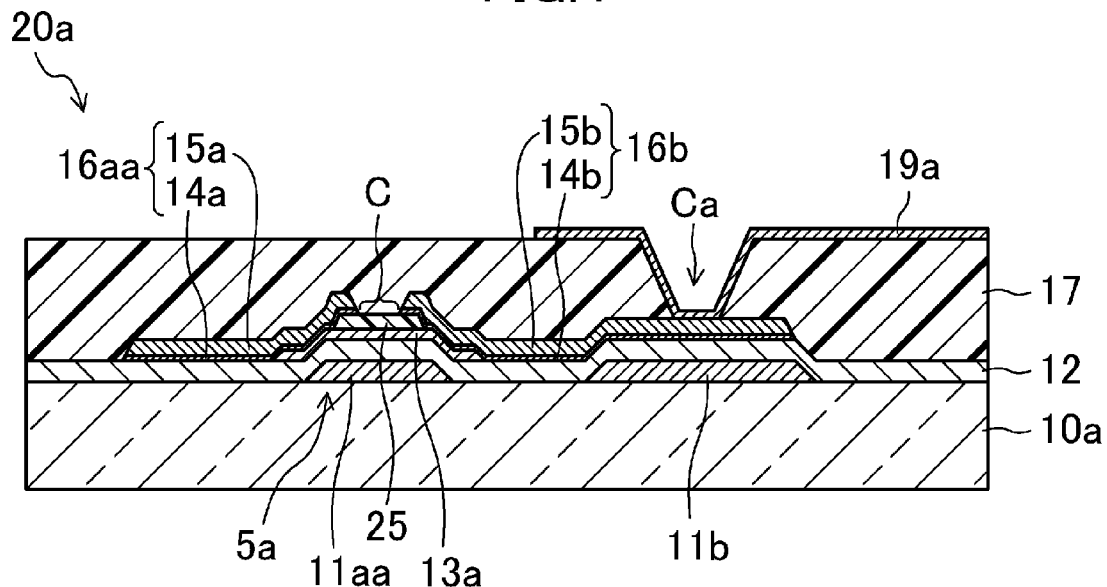
FIG. 4 is a cross-sectional view of the thin film transistor substrate taken along the line A-A of FIG. 3.
Figure 5:
FIG. 5 is a cross-sectional view for explaining a channel protection layer in the thin film transistor substrate according to the first embodiment of the present disclosure.

FIG. 1 is a cross-sectional view of a liquid crystal display device having a thin film transistor substrate according to the first embodiment of the present disclosure. FIG. 2 is a plan view of the thin film transistor substrate according to the first embodiment of the present disclosure. FIG. 3 is an enlarged plan view of a pixel portion and a terminal portion of the thin film transistor substrate according to the first embodiment of the present disclosure. FIG. 4 is a cross-sectional view of the thin film transistor substrate taken along the line A-A of FIG. 3. FIG. 5 is a cross-sectional view for explaining a channel protection layer in the thin film transistor substrate according to the first embodiment of the present disclosure.

As shown in FIG. 1, a liquid crystal display device 50 includes a thin film transistor substrate 20a which is a display device substrate, and a counter substrate 30 which is another display device substrate located so as to face the thin film transistor substrate 20a, and a liquid crystal layer 40 which is a display medium layer provided between the thin film transistor substrate 20a and the counter substrate 30. The liquid crystal display device 50 further includes a frame-like sealing material 35 for bonding the thin film transistor substrate 20a and the counter substrate 30 together and enclosing the liquid crystal layer 40 between the thin film transistor substrate 20a and the counter substrate 30.

In the liquid crystal display device 50, as shown in FIG. 1, a region surrounded by the sealing material 35 is defined as a display region D configured to display an image, and a region on the thin film transistor substrate 20a outside the counter substrate 30 is defined as a terminal region T.

As shown in FIG. 2, FIG. 3 and FIG. 4, the thin film transistor substrate 20a includes an insulating substrate 10a, and in the display region D, a plurality of scanning lines 11a provided on the insulating substrate 10a and extending in parallel to each other, a plurality of auxiliary capacitor lines 11b each provided between the scanning lines 11a and extending in parallel to each other, and a plurality of signal lines 16a extending in parallel to each other in a direction orthogonal to the scanning lines 11a. The thin film transistor substrate 20a includes a plurality of TFTs 5a each provided for an intersection of the scanning line 11a and the signal line 16a, that is, provided for each pixel, an interlayer insulating film 17 provided so as to cover the TFTs 5a, a plurality of pixel electrodes 19a arranged in a matrix on the interlayer insulating film 17 and each connected to a corresponding one of the TFTs 5a, and an alignment film (not shown) provided so as to cover the pixel electrodes 19a.

As shown in FIG. 2 and FIG. 3, the scanning line 11a is extended into a gate terminal region Tg of the terminal region T (see FIG. 1), and connected to a gate terminal 19b in the gate terminal region Tg.

As shown in FIG. 3, the auxiliary capacitor line 11b is connected to an auxiliary capacitor terminal 19d via an auxiliary capacitor main line 16c and a relay line 11d. The auxiliary capacitor main line 16c is connected to the auxiliary capacitor line 11b via a contact hole Cc formed in a gate insulating film 12, and is also connected to the relay line 11d via a contact hole Cd formed in the gate insulating film 12.

As shown in FIG. 2 and FIG. 3, the signal line 16a is extended into a source terminal region Ts of the terminal region T (see FIG. 1) as a relay line 11c, and is connected to a source terminal 19c in the source terminal region Ts.

As shown in FIG. 3, the signal line 16a is connected to the relay line 11c via a contact hole Cb formed in the gate insulating film 12.

Each of the TFTs 5a has a bottom gate structure. As shown in FIG. 3 and FIG. 4, the TFT 5a includes a gate electrode 11aa provided on the insulating substrate 10a, the gate insulating film 12 provided so as to cover the gate electrode 11aa, a semiconductor layer 13a having an island-shaped channel region C which is located above the gate insulating film 12 and overlaps the gate electrode 11aa. The TFT 5a also includes a source electrode 16aa and a drain electrode 16b which are located on or above the semiconductor layer 13a and overlap the gate electrode 11aa, and which face each other with the channel region C interposed therebetween.

Here, the interlayer insulating film 17 is provided above the channel region C of the semiconductor layer 13a to cover the source electrode 16aa and the drain electrode 16b (i.e., the TFT 5a).

As shown in FIG. 3, the gate electrode 11aa is a laterally protruding portion of the scanning line 11a. The source electrode 16aa is a laterally protruding portion of the signal line 16a as shown in FIG. 3, and is comprised of a multilayer film including a first conductive layer 14a and a second conductive layer 15a as shown in FIG. 4.

The drain electrode 16b is comprised of a multilayer film including a first conductive layer 14b and a second conductive layer 15b as shown in FIG. 3 and FIG. 4, and is connected to a pixel electrode 19a via a contact hole Ca formed in the interlayer insulating film 17. Further, the drain electrode 16b overlaps the auxiliary capacitor line 11b via the gate insulating film 12, thereby comprising an auxiliary capacitor.

The semiconductor layer 13a may be made of oxide semiconductor, such as an indium gallium zinc oxide (IGZO), and amorphous silicon, for example. In the case where amorphous silicon is used, the semiconductor layer 13a includes an intrinsic amorphous silicon layer as a lower layer, and a phosphorus-doped $n^+$ amorphous silicon layer as an upper layer. The intrinsic amorphous silicon layer which does not overlap the source electrode 16aa and the drain electrode 16b forms the channel region C.

As shown in FIG. 16(c) described later, the counter substrate 30 includes an insulating substrate 10b, and a color filter layer which includes a black matrix 21 provided on the insulating substrate 10b in a grid pattern and a color layer 22 including red, green, and blue layers provided between the grid lines of the black matrix 21. The counter substrate 30 also includes a common electrode 23b provided so as to cover the color filter layer, a photo spacer 24 provided on the common electrode 23, and an alignment film (not shown) provided to cover the common electrode 23.

The liquid crystal layer 40 is made of a nematic liquid crystal material having electro-optic characteristics, for example.

In each of the pixels of the liquid crystal display device 50 having the above configuration, when the TFT 5a is turned on by a gate signal sent from a gate driver (not shown) to the gate electrode 11aa via the scanning line 11a, a source signal is sent from a source driver (not shown) to the source electrode 16aa via the signal line 16a, so that a predetermined charge is applied to the pixel electrode 19a via the semiconductor layer 13a and the drain electrode 16b.

At this moment, a potential difference occurs between each pixel electrode 19a of the thin film transistor substrate 20a and the common electrode 23 of the counter substrate 30, thereby applying a predetermined voltage to the liquid crystal layer 40, that is, to a liquid crystal capacitor of each pixel, and an auxiliary capacitor connected in parallel to the liquid crystal capacitor.

In the liquid crystal display device 50, the alignment of the liquid crystal layer 40 is changed in each of the pixels according to the magnitude of the voltage applied to the liquid crystal layer 40, whereby light transmittance of the liquid crystal layer 40 is adjusted and an image is displayed.

In the present embodiment, as shown in FIG. 4, a channel protection layer (an etch stopper layer) 25 which protects the channel region C is provided in the channel region C of the semiconductor layer 13a (i.e., above the channel region C of the semiconductor layer 13a). The channel protection layer 25 can protect the channel region C of the semiconductor layer 13a from being etched in a source/drain formation step, described later, in which the source electrode 16aa and the drain electrode 16b are formed by patterning by etching.

The present embodiment is characterized in that the channel protection layer 25 is comprised of a multilayer film in which the first insulating films 25a and the second insulating films 25b are alternately layered as shown in FIG. 5, and the ratio between refractive indexes of the first insulating film 25a and the second insulating film 25b is 1.3 or more.

For example, the relationship between the refractive index Ra of the first insulating film 25a and the refractive index Rb of the second insulating film 25b is Rb/Ra≥1.3.

The first and second insulating films 25a, 25b are made of insulating materials, such as a silicon nitride film, a silicon oxide film, and a silicon nitride oxide film.

Due to this structure in the present embodiment, light having a specific wavelength (in particular, light having a short wavelength of 600 nm or less which induces degradation of the TFT 5a) can be effectively reflected on the channel protection layer 25, thereby making it possible to prevent light having a specific wavelength which induces degradation of the semiconductor layer 13a from coming into the channel region C of the semiconductor layer 13a. Thus, it is possible to prevent a reduction in TFT properties due to light irradiation of the channel region C of the semiconductor layer 13a, and a reduction in display quality of the liquid crystal display device 50.

Since the channel protection layer 25 is comprised of a multilayer film in which the first and second insulating films 25a, 25b are layered one another, properties of the TFTs 5a are not affected by the channel protection layer 25, and light irradiation of the channel region C can be effectively reduced, unlike the conventional technique in which a metal layer made of a conductive metal material is provided for blocking light.

In the conventional technique, steps of forming a metal film, patterning a resist by photolithography using a photomask in a predetermined pattern shape, wet etching the metal film, and performing resist removal and cleaning, etc., are necessary in forming a metal layer, which may lead to disadvantages such as an increase in fabrication cost and a reduction in yields.

On the other hand, in the present embodiment, the channel protection layer 25 is made of a multilayer film in which the first and second insulating films 25a, 25b are layered with one another. Thus, in forming the multilayer film in which the first and second insulating films 25a, 25b are layered by sequentially forming a silicon nitride film and a silicon oxide film, by, for example, plasma CVD, the channel protection layer 25 can be formed by only changing source gas in a plasma apparatus. This means that unlike the case of the light blocking metal layer made of a conductive metal material, steps such as forming a metal film, patterning a resist by photolithography using a photomask, wet etching the metal film, performing resist removal and cleaning, etc., are not necessary, and the number of steps can be reduced. As a result, it is possible to reduce an increase in fabrication cost and a reduction in yields.

In order to reliably reflect light having a specific wavelength which induces degradation of the semiconductor layer 13a, the number of the insulating films 25a, 25b included in the multilayer film which comprises the channel protection layer 25 is preferably 5 or more, and is not limited to any number as long as the number is 5 or more.

Figure 6:
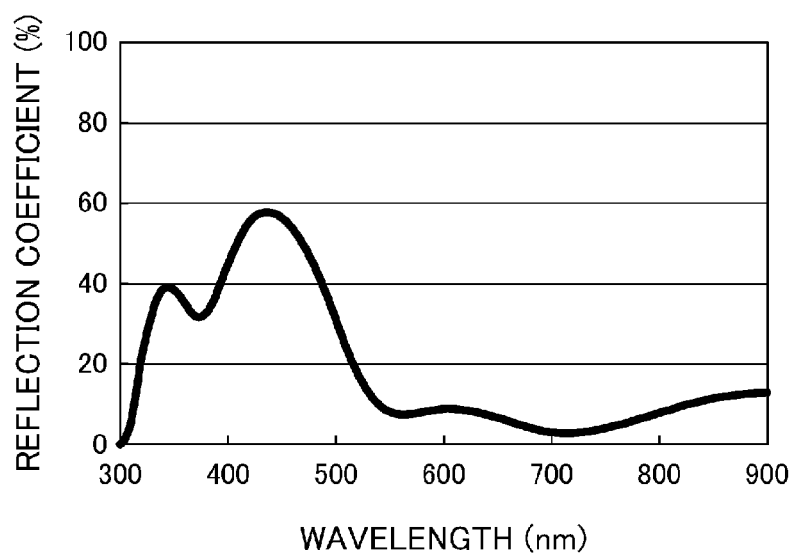
FIG. 6 is a graph showing a relationship between a wavelength and a reflection coefficient of polarized light P in the case where the number of first and second insulating films in a multilayer film is five.

The characteristics will be described in detail below. FIG. 6 is a graph showing a relationship between a wavelength and a reflection coefficient of polarized light P in the case where the number of the first and second insulating films 25a, 25b in the multilayer film is five.

In the relationship shown in FIG. 6, a silicon oxide film having a refractive index Ra of 1.4 and a thickness of 60 nm is used as the first insulating film 25a, and a silicon nitride film having a refractive index Rb of 2 and a thickness of 60 nm is used as the second insulating film 25b. Further, a silicon oxide film having a refractive index of 1.4 and a thickness of 265 nm is used as the interlayer insulating film 17; a nematic liquid crystal material having a refractive index of 1 is used as the liquid crystal layer 40; and indium gallium zinc oxide (IGZO) having a refractive index of 2 is used as the semiconductor layer 13a. The channel protection layer 25 is irradiated with polarized light P vertically through the liquid crystal layer 40, and a reflection coefficient is measured by changing the wavelength of the incident polarized light P by 1 nm in a wavelength range of 300 nm to 900 nm.

As shown in FIG. 6, the channel protection layer 25 comprised of the first and second insulating films 25a, 25b reflects light over a wide wavelength range of a visible light range (from 360 nm to 760 nm), especially reflects approximately 60% of the polarized light P having a wavelength of 450 nm.

Figure 7:
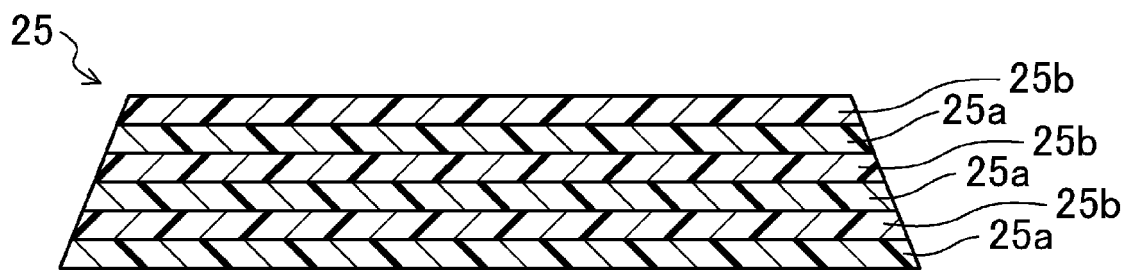
FIG. 7 is a cross-sectional view for explaining the channel protection layer in the thin film transistor substrate according to the first embodiment of the present disclosure.
Figure 8:
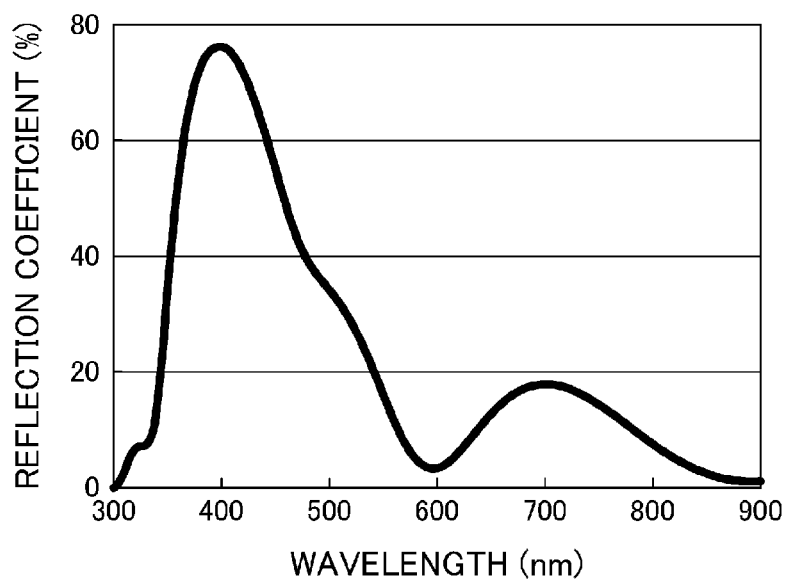
FIG. 8 is a graph showing a relationship between a wavelength and a reflection coefficient of polarized light P in the case where the number of first and second insulating films in the multilayer film is six.

FIG. 8 shows a relationship between a wavelength and a reflection coefficient of the polarized light P in the case where another second insulating film 25b is added to the channel protection layer 25 so that the channel protection layer 25 includes six layers (see FIG. 7).

As shown in FIG. 8, the channel protection layer 25 reflects light over a wide wavelength range of a visible light range (from 360 nm to 760 nm), especially reflects approximately 80% of the polarized light P having a wavelength of 400 nm.

Figure 9:
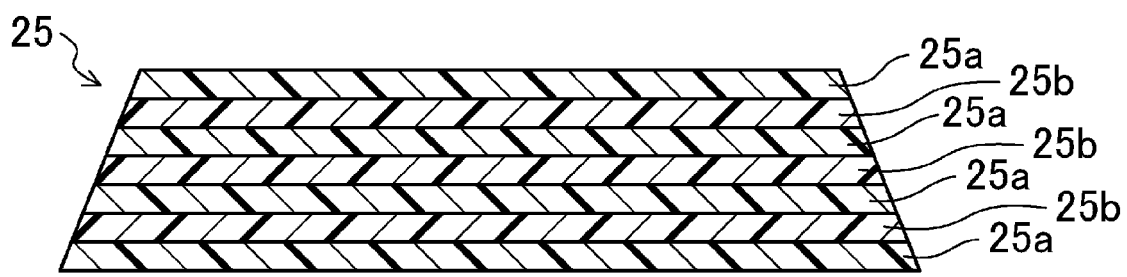
FIG. 9 is a cross-sectional view for explaining the channel protection layer in the thin film transistor substrate according to the first embodiment of the present disclosure.
Figure 10:
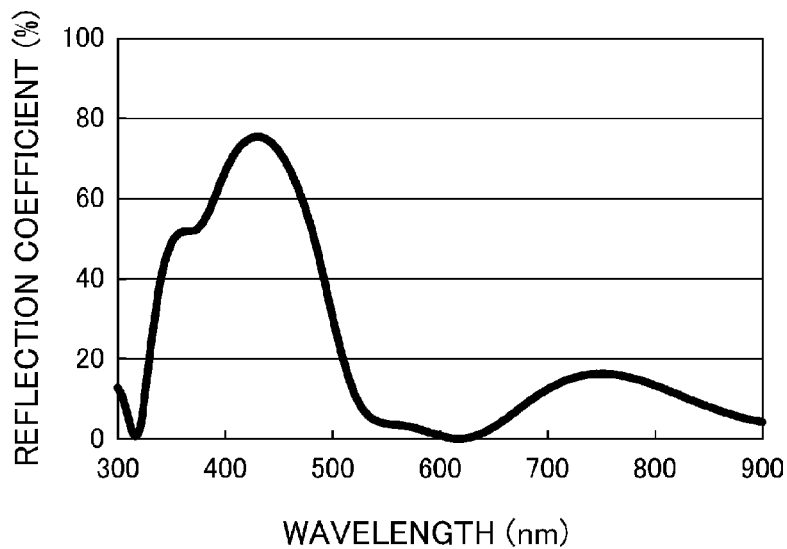
FIG. 10 is a graph showing a relationship between a wavelength and a reflection coefficient of polarized light P in the case where the number of first and second insulating films in the multilayer film is seven.

FIG. 10 shows a relationship between a wavelength and a reflection coefficient of the polarized light P in the case where another first insulating film 25a is added to the channel protection layer 25 so that the channel protection layer 25 includes seven layers (see FIG. 9).

As shown in FIG. 10, the channel protection layer 25 reflects light over a wide wavelength range of a visible light range (from 360 nm to 760 nm), and especially reflects approximately 80% of the polarized light P having a wavelength of 440 nm.

Figure 11:
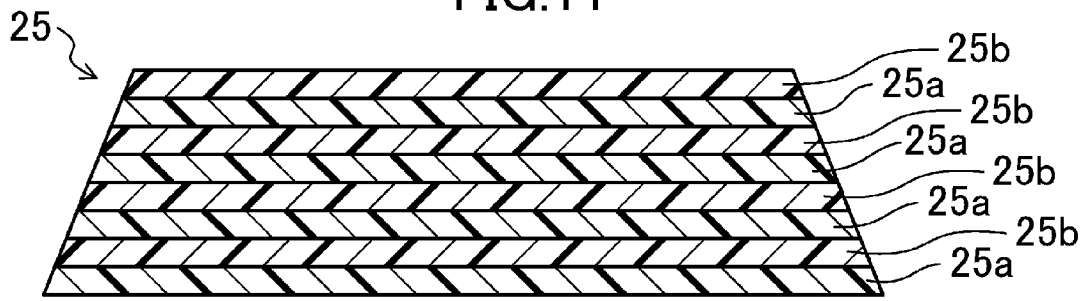
FIG. 11 is a cross-sectional view for explaining the channel protection layer in the thin film transistor substrate according to the first embodiment of the present disclosure.
Figure 12:
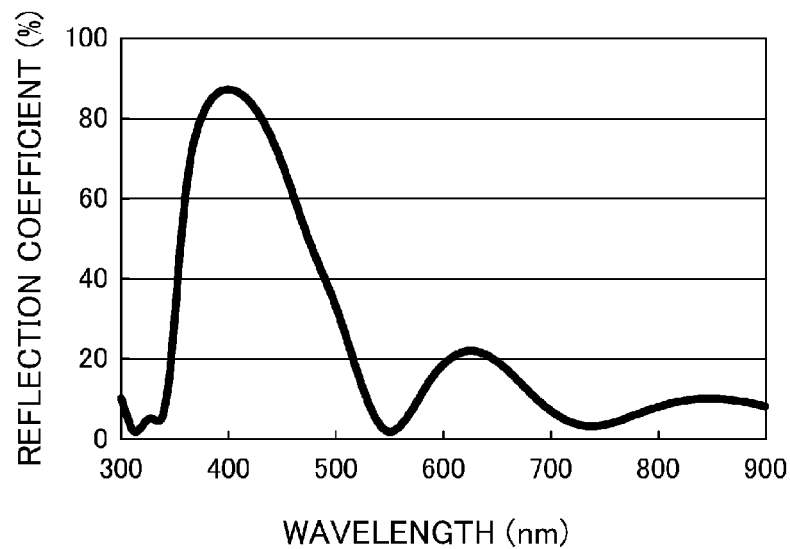
FIG. 12 is a graph showing a relationship between a wavelength and a reflection coefficient of polarized light P in the case where the number of first and second insulating films in the multilayer film is eight.

FIG. 12 shows a relationship between a wavelength and a reflection coefficient of the polarized light P in the case where another second insulating film 25b is added to the channel protection layer 25 so that the channel protection layer 25 includes eight layers (see FIG. 11).

As shown in FIG. 12, the channel protection layer 25 reflects light over a wide wavelength range of a visible light range (from 360 nm to 760 nm), and especially reflects approximately 90% of the polarized light P having a wavelength of 400 nm.

Figure 13:
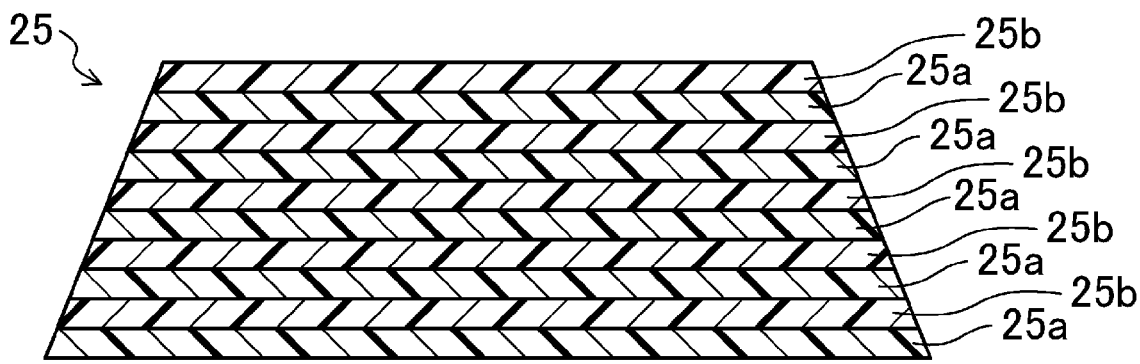
FIG. 13 is a cross-sectional view for explaining the channel protection layer in the thin film transistor substrate according to the first embodiment of the present disclosure.
Figure 14:
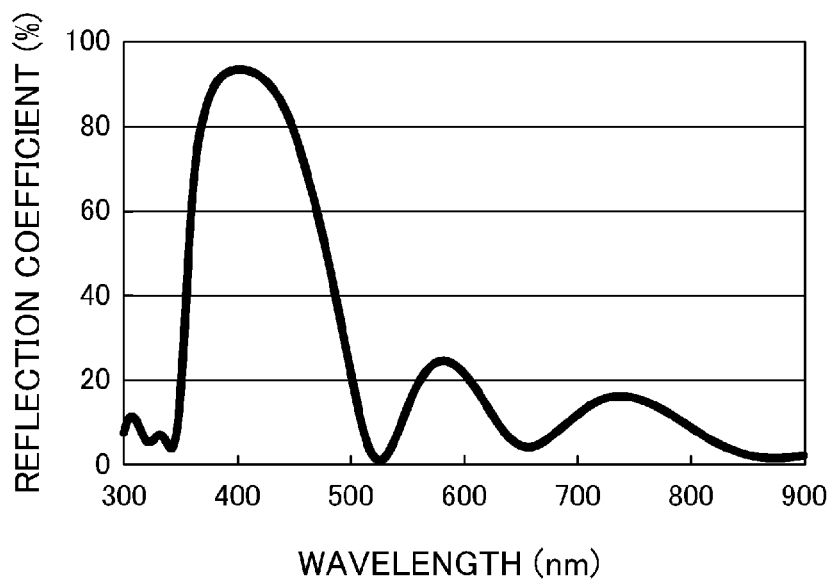
FIG. 14 is a graph showing a relationship between a wavelength and a reflection coefficient of polarized light P in the case where the number of first and second insulating films in the multilayer film is ten.

FIG. 14 shows a relationship between a wavelength and a reflection coefficient of the polarized light P in the case where another first insulating film 25a and another second insulating film 25b are added to the channel protection layer 25 so that the channel protection layer 25 includes ten layers (see FIG. 13).

As shown in FIG. 14, the channel protection layer 25 reflects light over a wide wavelength range of a visible light range (from 360 nm to 760 nm), and especially reflects approximately 95% of the polarized light P having a wavelength of 400 nm.

It is known from the above descriptions that if the number of the first and second insulating films 25a, 25b is five or more, the channel protection layer 25 can effectively reflect light having a short wavelength of 600 nm or less which induces degradation of the TFT 5a, and that the light reflection efficiency increases with an increase in the number of the first and second insulating films 25a, 25b.

Figure 15:
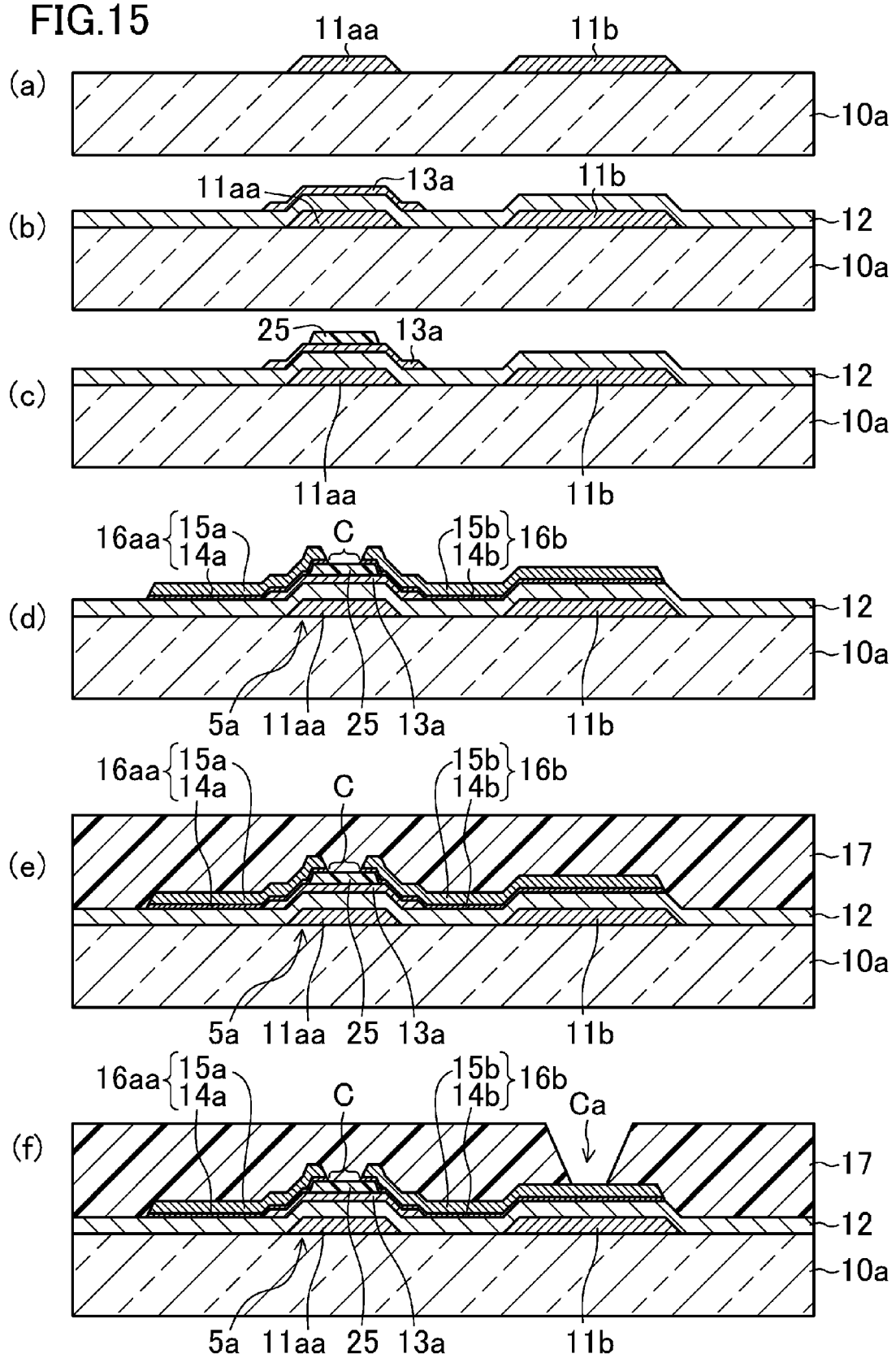
FIG. 15 shows cross-sectional views for explaining steps for fabricating the TFT and the thin film transistor substrate according to the first embodiment of the present disclosure.
Figure 16:
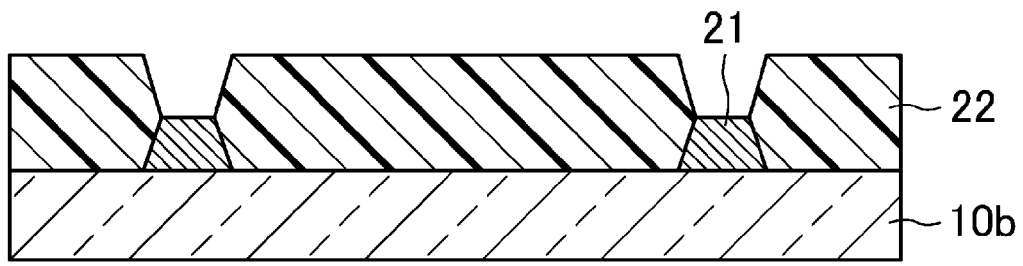
FIG. 16 shows cross-sectional views for explaining steps for fabricating a counter substrate according to the first embodiment of the present disclosure.
Figure 16:
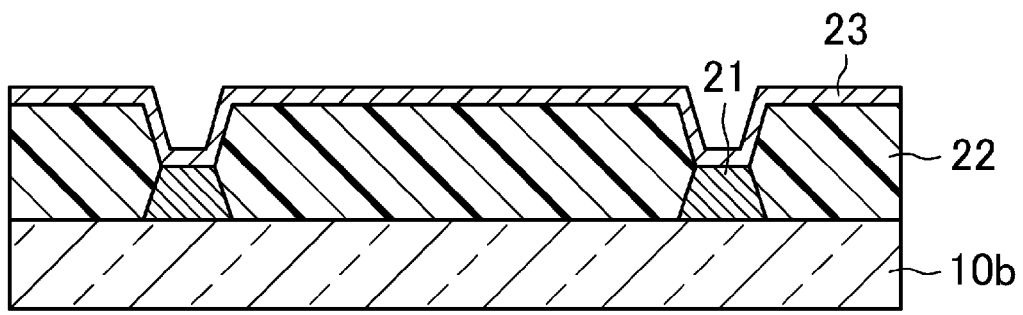
Figure 16:
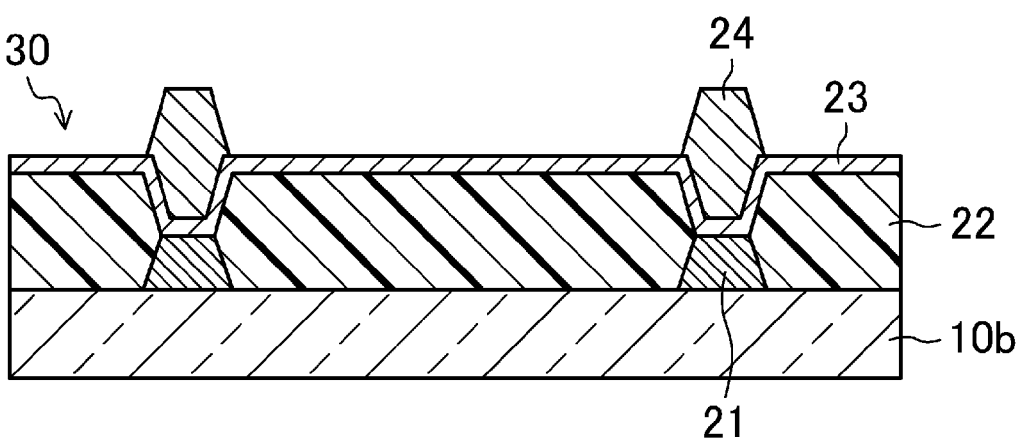

Next, an example method for fabricating the liquid crystal display device 50 of the present embodiment will be described with reference to FIG. 15 and FIG. 16. FIG. 15 shows cross-sectional views for explaining steps for fabricating a TFT and a thin film transistor substrate. FIG. 16 shows cross-sectional views for explaining steps of fabricating a counter substrate. The fabrication method of the present embodiment includes a step of fabricating the thin film transistor substrate, a step of fabricating the counter substrate, and a liquid crystal injection step.

First, a step of fabricating the TFT and the thin film transistor substrate will be described.

<Gate Electrode Formation Step>

First, a molybdenum film (having a thickness of about 150 nm), for example, is formed by sputtering on the entire insulating substrate 10, such as a glass substrate, a silicon substrate, and a heat-resistant plastic substrate. Then, the molybdenum film is subjected to photolithography, wet etching and resist removal and cleaning, thereby forming a scanning line 11a, a gate electrode 11aa, an auxiliary capacitor line 11b, and relay lines 11c, 11d as shown in FIG. 3 and FIG. 15(a).

In the present embodiment, a molybdenum film having a single layer structure is illustrated as a metal film which forms the gate electrode 11aa. However, the gate electrode 11aa may be formed, for example, of a metal film, such as an aluminum film, a tungsten film, a tantalum film, a chromium film, a titanium film and a copper film, or an alloy film of the metal, or a nitride film of the metal, which has a thickness of from 50 nm to 300 nm.

The material which forms the plastic substrate includes, for example, polyethlene terephthalate resin, polyethylene naphthalate resin, polyethersulfone resin, acrylic resin, and polyimide resin.

<Semiconductor Layer Formation Step>

Then, a silicon nitride film (having a thickness of about from 200 nm to 500 nm), for example, is formed by CVD on the entire substrate on which the scanning line 11a, the gate electrode 11aa, the auxiliary capacitor line 11b, and the relay lines 11c, 11d are provided, thereby forming a gate insulating film 12 which covers the gate electrode 11aa and the auxiliary capacitor line 11b, as shown in FIG. 15(b).

The gate insulating film 12 may have a multilayer structure including two layers. In this case, in addition to the silicon nitride film (SiNx) described above, a silicon oxide film (SiOx), a silicon oxynitride film (SiOxNy, x>y), a silicon nitride oxide film (SiNxOy, x>y) may be used, for example.

Further, in order to prevent impurities from being diffused from the insulating substrate 10a, it is preferable that a silicon nitride film or a silicon nitride oxide film is used as a lower-side gate insulating film, and a silicon oxide film or a silicon oxynitride film is used as an upper-side gate insulating film. For example, a silicon nitride film having a thickness of from 100 nm to 200 nm may be formed as the lower-side gate insulating film, using $SiH_4$ and $NH_3$ as a reactant gas, and a silicon oxide film having a thickness of from 50 nm and 100 nm may be formed as the upper-side gate insulating film, using $N_2O$, $SiH_4$ as a reactant gas.

Further, in order to form, at a low temperature, a close-grained gate insulating film 12 with less gate leakage current, it is preferable that the reactant gas contains a rare gas, such as argon gas, and the rare gas is mixed in the insulating film.

Then, an IGZO-based oxide semiconductor film (having a thickness of about from 30 nm to 100 nm), for example, is formed by sputtering. Thereafter, the oxide semiconductor film is subjected to photolithography, wet etching and resist removal and cleaning, thereby forming a semiconductor layer 13a having a channel region, as shown in FIG. 15(b).

<Channel Protection Layer Formation Step>

Next, a silicon nitride film and a silicon oxide film, for example, are sequentially formed by plasma CVD on the entire substrate on which the semiconductor layer 13a is provided, thereby forming a multilayer film in which the first and second insulating films 25a, 25b shown in FIG. 5 are layered. The multilayer film is the channel protection layer 25 having a thickness of about from 50 to 150 nm and formed in the channel region C of the semiconductor layer 13a for protecting the channel region C.

Since the channel protection layer 25 is comprised of the multilayer film including the first and the second insulating films 25a, 25b, the channel protection layer 25 can be formed by only changing source gas in a plasma apparatus, as mentioned above.

For example, a silicon oxide film having a refractive index Ra of 1.4 and a thickness of 60 nm is formed as the first insulating film 25a, and a silicon nitride film having a refractive index Rb of 2 and a thickness of 60 nm is formed as the second insulating film 25b.

<Source/Drain Formation Step>

Then, a titanium film (having a thickness of from 30 nm to 150 nm) and a copper film (having a thickness of about from 50 nm to 400 nm), for example, are sequentially formed by sputtering on the entire substrate on which the semiconductor layer 13a is formed. Thereafter, the copper film is subjected to photolithography and wet etching, and the titanium film is subjected to dry etching and resist removal and cleaning, thereby forming a signal line 16a (see FIG. 3), a source electrode 16aa, a drain electrode 16b and an auxiliary capacitor main line 16c (see FIG. 3), and exposing the channel region C of the semiconductor layer 13a, as shown in FIG. 15(d).

That is, in the present step, the source electrode 16aa and the drain electrode 16b are formed by dry etching on the semiconductor layer 13a formed in the semiconductor layer formation step, and the channel region C of the semiconductor layer 13a is exposed.

In the present embodiment, a titanium film and a copper film in a multilayer structure are illustrated as a metal film which forms the source electrode 16aa and the drain electrode 16b. However, the source electrode 16aa and the drain electrode 16b may be formed, for example, of a metal film, such as an aluminum film, a tungsten film, a tantalum film and a chromium film, or an alloy film of the metal, or a nitride film of the metal.

The etching may be dry etching as described above, or may be wet etching, but dry etching is preferable if the etching is performed on a large area substrate. As an etching gas, a fluorine gas such as $CF_4$, $NF_3$, $SF_6$ and $CHF_3$, a chlorine gas such as $Cl_2$, $BCl_3$, $SiCl_4$ and $CCl_4$, an oxygen gas, etc., may be used. An inert gas such as helium and argon may also be added.

<Interlayer Insulating Film Formation Step>

Next, a silicon oxide film, for example, is formed by plasma CVD on the entire substrate on which the source electrode 16aa and the drain electrode 16b are formed (i.e., on which the TFT 5a is formed), thereby forming an interlayer insulating film 17 having a thickness of about 265 nm and covering the TFT 5a (i.e., covering the semiconductor layer 13a, the source electrode 16aa, and the drain electrode 16b) as shown in FIG. 15(e).

<Opening Formation Step>

Then, the interlayer insulating film 17 is exposed to light and is developed, thereby forming a contact hole Ca which reaches the drain electrode 16b in the interlayer insulating film 17 as shown in FIG. 15(f).

<Pixel Electrode Formation Step>

Next, for example, a transparent conductive film, such as an ITO film (having a thickness of about from 50 nm to 200 nm) made of an indium tin oxide, by sputtering on the entire substrate on which the interlayer insulating film 17 is formed. Then, the transparent conductive film is subjected to photolithography, wet etching and resist removal and cleaning, thereby forming a pixel electrode 19a, a gate terminal 19b, a source terminal 19c and an auxiliary capacitor terminal 19d (see FIG. 3) as shown in FIG. 4.

As shown in FIG. 4, the pixel electrode 19a is provided on a surface of the interlayer insulating film 17 such that the pixel electrode 19a covers a surface of the contact hole Ca.

In the case of forming a transmissive liquid crystal display device 50, the pixel electrode 19a may be made of an indium oxide including a tungsten oxide, an indium zinc oxide, an indium oxide including a titanium oxide, an indium tin oxide, etc. Further, in addition to the indium tin oxide (ITO) described above, an indium zinc oxide (IZO), an indium tin oxide (ITSO) including silicon oxide may also be used.

In the case of forming a reflection type liquid crystal display device 50, a conductive film made of titanium, tungsten, nickel, gold, platinum, silver, aluminum, magnesium, calcium, lithium, and an alloy of the metal may be used as a reflective thin metal film, and the thin metal film may be used as the pixel electrode 19a.

The thin film transistor substrate 20a shown in FIG. 4 can be obtained in the foregoing manner.

<Step of Fabricating Counter Substrate>

First, a black-colored photosensitive resin, for example, is applied to the entire insulating substrate 10b, such as a glass substrate, by spin coating or slit coating, and the applied film is exposed to light and is developed, thereby forming a black matrix 21 having a thickness of about 1.0 µm, as shown in FIG. 16(a).

Then, a red-, green-, or blue-colored photosensitive resin, for example, is applied by spin coating or slit coating to the entire substrate on which the black matrix 21 is provided. Thereafter, the applied film is exposed to light and is developed, thereby forming a color layer 22 of a selected color (e.g., a red layer) with a thickness of about 2.0 µm as shown in FIG. 16(a). Similar steps are repeated for the remaining two colors to form color layers 22 of the two colors (e.g., a green layer and a blue layer) with a thickness of about 2.0 µm.

Further, a transparent conductive film such as an ITO film, for example, is formed by sputtering on the substrate on which the color layers 22 of the respective colors are provided, thereby forming a common electrode 23 with a thickness of about from 50 nm to 200 nm as shown in FIG. 16(b).

Lastly, a photosensitive resin is applied by spin coating or slit coating on the entire substrate on which the common electrode 23 is provided. Thereafter, the applied film is exposed to light and is developed, thereby forming a photo spacer 24 with a thickness of about 4 µas shown in FIG. 16(c).

The counter substrate 30 can be obtained in the foregoing manner.

<Liquid Crystal Injection Step>

First, a polyimide film is applied, by printing, on each of surfaces of the thin film transistor substrate 20a formed in the step of fabricating the thin film transistor substrate, and of the counter substrate 30 formed in the step of fabricating the counter substrate. Thereafter, each applied film is subjected to baking and rubbing treatment, thereby forming an alignment film.

Next, for example, a sealing material made of an ultraviolet (UV)/thermosetting resin is printed in a frame-like shape on the surface of the counter substrate 30 on which the alignment film is provided, and then a liquid crystal material is dropped in an area surrounded by the sealing material.

Thereafter, the counter substrate 30 on which the liquid crystal material has been dropped and the thin film transistor substrate 20a on which the alignment film is provided are bonded together under a reduced pressure, and the bonded body is exposed to an atmospheric pressure to pressurize the front and back surfaces of the bonded body.

Subsequently, the sealing material enclosed in the bonded body is irradiated with UV light, and then the bonded body is heated to cure the sealing material.

Lastly, the bonded body enclosing the cured sealing material is cut by dicing, for example, and unwanted portions thereof are removed.

The liquid crystal display device 50 of the present embodiment can be obtained in the foregoing manner.

The present embodiment described above can obtain the following advantages.

(1) In the present embodiment, the channel protection layer 25 is comprised of a multilayer film in which the first insulating films 25a and the second insulating films 25b are alternately layered. Further, the relationship between the refractive index Ra of the first insulating film 25a and the refractive index Rb of the second insulating film 25b is $Rb/Ra \geq 1.3$. Thus, light having a short wavelength of 600 nm or less which induces degradation of the TFT 5a can be effectively reflected on the channel protection layer 25, and it is possible to prevent light having a specific wavelength which induces degradation of the semiconductor layer 13a from coming into the channel region C of the semiconductor layer 13a. As a result, it is possible to effectively prevent a reduction in TFT properties due to light irradiation of the channel region C of the semiconductor layer 13a.

(2) Since the channel protection layer 25 is comprised of a multilayer film in which the first and second insulating films 25a, 25b are layered, properties of the TFTs 5a are not affected by the channel protection layer 25, and light irradiation of the channel region C can be effectively reduced, unlike the conventional technique in which a metal layer made of a conductive metal material is provided for blocking light.

(3) The channel protection layer 25 is made of a multilayer film in which the first and second insulating films 25a, 25b are layered. Thus, in forming the multilayer film in which the first and second insulating films 25a, 25b are layered, the channel protection layer 25 can be formed by only changing source gas in a plasma apparatus. It is therefore possible to reduce the number of steps, and thus reduce an increase in fabrication cost and a reduction in yields.

(4) In the present embodiment, the number of layers in the multilayer film is five or more. Thus, light having a specific wavelength which induces degradation of the semiconductor layer 13a can be effectively reflected.

(Second Embodiment)

Figure 17:
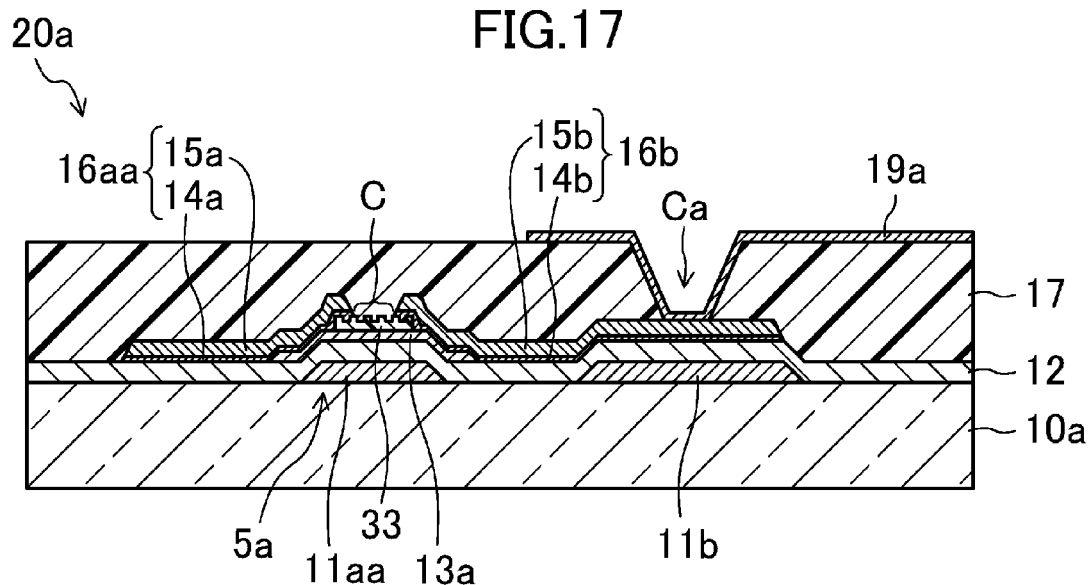
FIG. 17 is a cross-sectional view of a thin film transistor substrate according to the second embodiment of the present disclosure.
Figure 18:
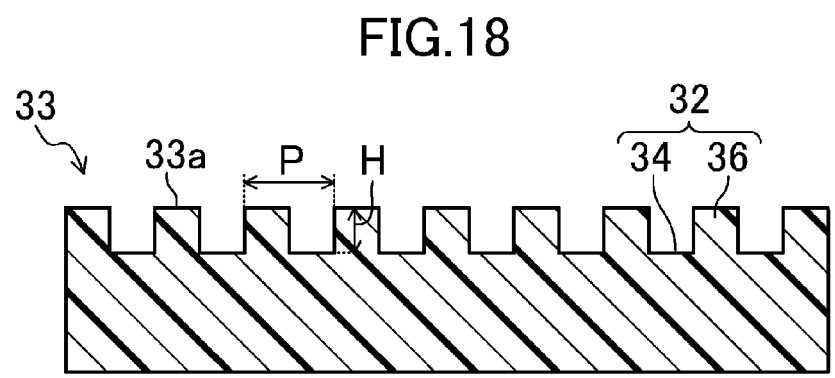
FIG. 18 is a cross-sectional view for explaining a channel protection layer in the thin film transistor substrate according to the second embodiment of the present disclosure.
Figure 19:
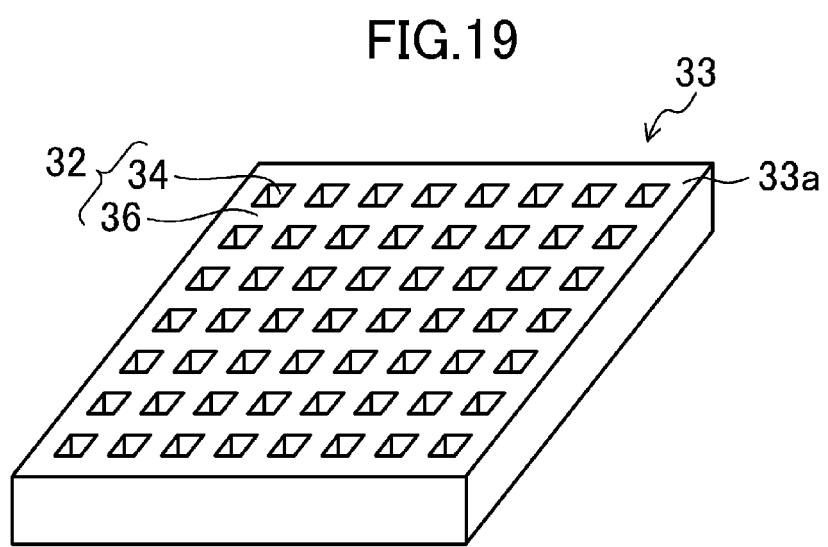
FIG. 19 is an oblique view for explaining the channel protection layer in the thin film transistor substrate according to the second embodiment of the present disclosure.

Next, the second embodiment of the present disclosure will be described. FIG. 17 is a cross-sectional view of a thin film transistor substrate according to the second embodiment of the present disclosure. FIG. 18 is a cross-sectional view for explaining a channel protection layer in the thin film transistor substrate according to the second embodiment of the present disclosure. FIG. 19 is an oblique view for explaining a channel protection layer in the thin film transistor substrate according to the second embodiment of the present disclosure. In the present embodiment, like reference characters have been used to designate similar elements in the first embodiment, and explanation thereof is omitted. The general configuration of the liquid crystal display device and a fabrication method thereof are similar to those described in the first embodiment. Thus, detailed explanation thereof is omitted here.

In the present embodiment, as shown in FIG. 17, the channel protection layer 25 described above is replaced with a channel protection layer 33 having a fine projection/recess structure on its surface.

More specifically, as shown in FIG. 17 to FIG. 19, a fine projection/recess structure 32 which includes a recess 34 and a projection 36 is formed in a surface 33a of the channel protection layer 33 which faces opposite the semiconductor layer 13a. Each of the recess 34 and the projection 36 has an approximately rectangular cross section.

Similar to the channel protection layer 25 described above, the channel protection layer 33 is made of an insulating material, such as a silicon nitride film, a silicon oxide film, and a silicon nitride oxide film.

In the present embodiment, in order to have the channel protection layer 33 reflect light over a wide wavelength range of a visible light range (from 360 nm to 760 nm), the distance (i.e., the pitch) P between adjacent projections 36 (or adjacent recesses 34) of the projection/recess structure 32 is set to 380 nm or less (i.e., P≤380 nm) which is smaller than half the wavelength of the visible light.

From a similar point of view, the height H of the projection 36 (or the depth of the recess 34) is set to 760 nm or more (i.e., H≥760 nm) which is equal to or larger than the maximum wavelength in the visible light range.

In the present embodiment, as well, similar to the case of the first embodiment, light having a specific wavelength (especially, visible light having a wavelength of 760 nm or less which induces degradation of the TFT 5a) can be effectively reflected due to light diffraction effects of the projection/recess structure 32. Thus, it is possible to prevent light having a specific wavelength which induces degradation of the semiconductor layer 13a from coming into the channel region C of the semiconductor layer 13a. As a result, it is possible to effectively prevent a reduction in TFT properties and a reduction in display quality of the liquid crystal display device 50 due to light irradiation of the channel region C of the semiconductor layer 13a.

Further, since the channel protection layer 33 is made of an insulating material, properties of the TFTs 5a are not affected by the channel protection layer 33, and light irradiation of the channel region C can be effectively reduced, unlike the conventional technique in which a metal layer made of a conductive metal material is provided for blocking light.

The projection/recess structure 32 of the channel protection layer 33 can be formed by photolithography and nanoimprint lithography.

Figure 20:
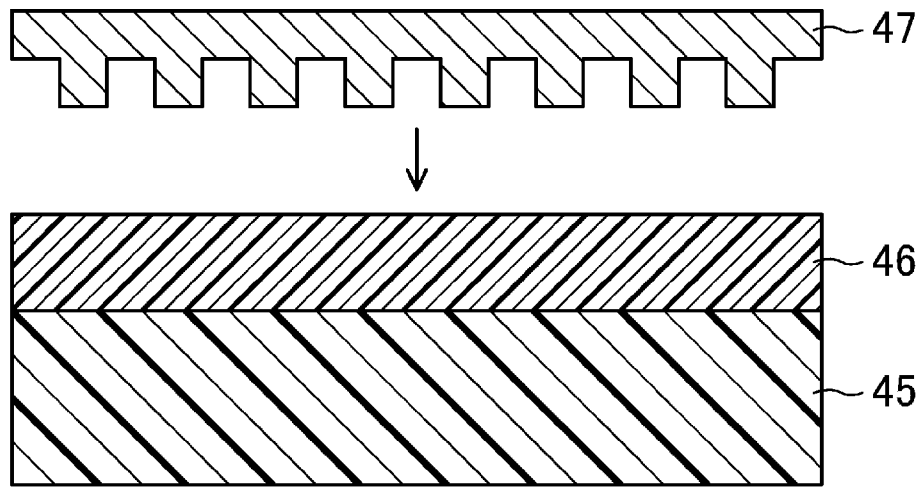
FIG. 20 is a cross-sectional view for explaining a step of forming the channel protection layer in the thin film transistor substrate according to second embodiment of the present disclosure, using a nanoimprint lithography method.
Figure 21:
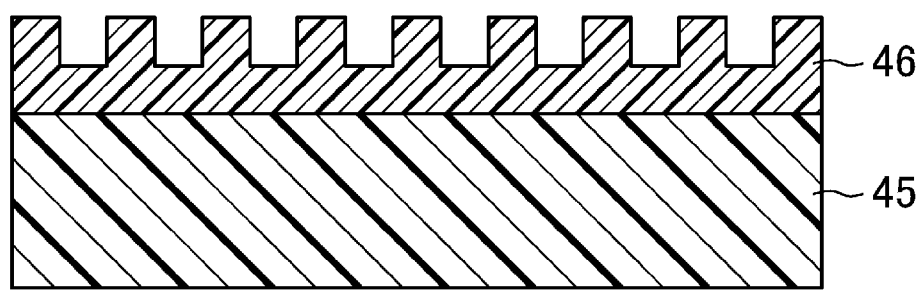
FIG. 21 is a cross-sectional view for explaining a step of forming the channel protection layer in the thin film transistor substrate according to second embodiment of the present disclosure, using a nanoimprint lithography method.

In the case of forming the projection/recess structure 32 of the channel protection layer 33 by nanoimprint lithography, for example, a silicon nitride film 45 which forms the channel protection layer 33 is provided first, and then a resist 46 is formed on the silicon nitride film 45, as shown in FIG. 20. Then, a mold 47 having projections and recesses whose shapes are to be transferred to the resist 46 is moved in the direction of the arrow in FIG. 20, and is pushed against the resist 46, and the resist 46 is cured using heat or light. The mold 47 is then removed. As a result, a predetermined mask pattern which corresponds to the projections and recesses of the mold 47 is formed on the resist 46 as shown in FIG. 21.

Figure 22:
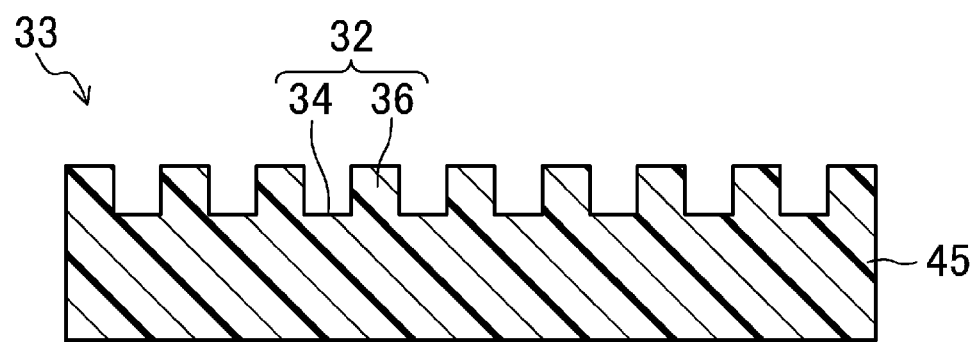
FIG. 22 is a cross-sectional view for explaining a step of forming the channel protection layer in the thin film transistor substrate according to second embodiment of the present disclosure, using a nanoimprint lithography method.

Next, the silicon nitride film 45 is etched using the resist 46 as a mask. The resist 46 are etched faster at the thinner portions thereof. Thus, the surface of the silicon nitride film 45 is etched according to the shape of the resist 46 as shown in FIG. 22, and the channel protection layer 33 having the projection/recess structure 32 is thereby formed.

Figure 23:
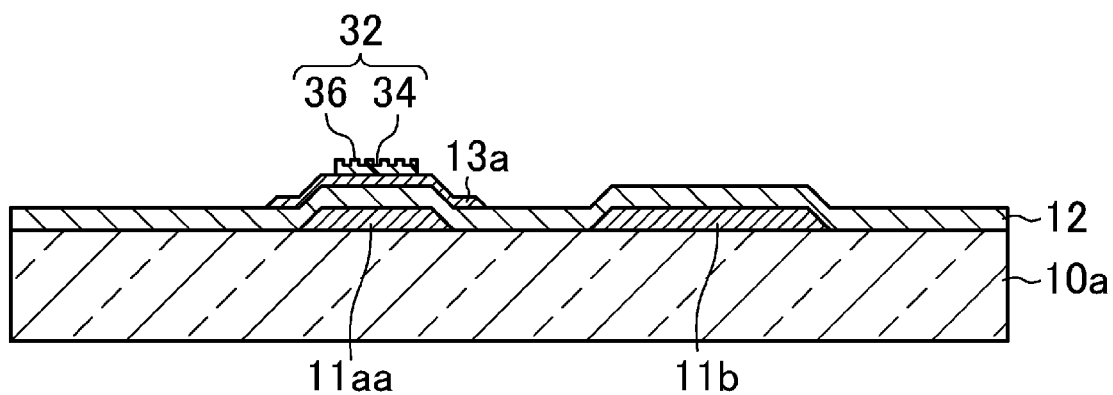
FIG. 23 shows a cross-sectional view for explaining a step of fabricating the TFT and the thin film transistor substrate according to the second embodiment of the present disclosure.

Now, an example method for fabricating the liquid crystal display device 50 of the present embodiment will be described with reference to FIG. 23. FIG. 23 shows a cross-sectional view for explaining a step of fabricating the TFT and the thin film transistor substrate according to the second embodiment of the present disclosure.

First, in a step of fabricating a TFT and an active matrix substrate, a gate electrode formation step and a semiconductor layer formation step similar to the steps described in FIGS. 15(a) and 15(b) in the first embodiment are performed.

<Channel Protection Layer Formation Step>

Next, a silicon nitride film, a silicon oxide film, or a silicon nitride oxide film, for example, is formed by plasma CVD on the entire substrate on which the semiconductor layer 13a is formed. After that, as shown in FIG. 23, a channel protection layer 33 having a fine projection/recess structure 32 including a recess 34 and a projection 36 in a surface 33a that faces opposite the semiconductor layer 13a is formed in a channel region by, for example, the nanoimprint lithography described above to have a thickness of about from 50 to 100 nm.

The channel protection layer 33 may be formed by photolithography using a resist as a mask and etching, instead of by nanoimprint lithography.

Next, similar to the steps described in FIGS. 15(d) to 15(f) of the first embodiment, a source/drain formation step, an interlayer insulating film formation step, an opening formation step, and a pixel electrode formation step are performed to fabricate the thin film transistor substrate 20a shown in FIG. 17.

The step of fabricating the counter substrate, and the liquid crystal injection step described in the first embodiment are further performed, thereby fabricating a liquid crystal display device 50 of the present embodiment.

The present embodiment described above can obtain the following advantages.

(5) In the present embodiment, the fine projection/recess structure 32 including the recess 34 and the projection 36 is formed in the surface 33a of the channel protection layer 33 which faces opposite the semiconductor layer 13a. Thus, visible light having a wavelength of 760 nm or less which induces degradation of the TFT 5a can be effectively reflected on the channel protection layer 33, thereby making it possible to prevent light having a specific wavelength which induces degradation of the semiconductor layer 13a from coming into the channel region C of the semiconductor layer 13a. Thus, it is possible to effectively prevent a reduction in TFT properties due to light irradiation of the channel region C of the semiconductor layer 13a.

(6) Further, since the channel protection layer 33 is comprised of an insulating material, properties of the TFTs 5a are not affected by the channel protection layer 33, and light irradiation of the channel region C can be effectively reduced, unlike the conventional technique in which a metal layer made of a conductive metal material is provided for blocking light.

(7) In the present embodiment, the distance between adjacent projections 36, or adjacent recesses 34 of the projection/recess structure 32 is set to 380 nm or less. Thus, the channel protection layer 33 can reflect light over a wider wavelength range of a visible light range (from 360 nm to 760 nm).

(8) In the present embodiment, the height of the projection 36, or the depth of the recess 34 is set to 760 nm or more. Thus, the channel protection layer 33 can reflect light over a wider wavelength range of a visible light range (from 360 nm to 760 nm).

(Third Embodiment)

Figure 24:
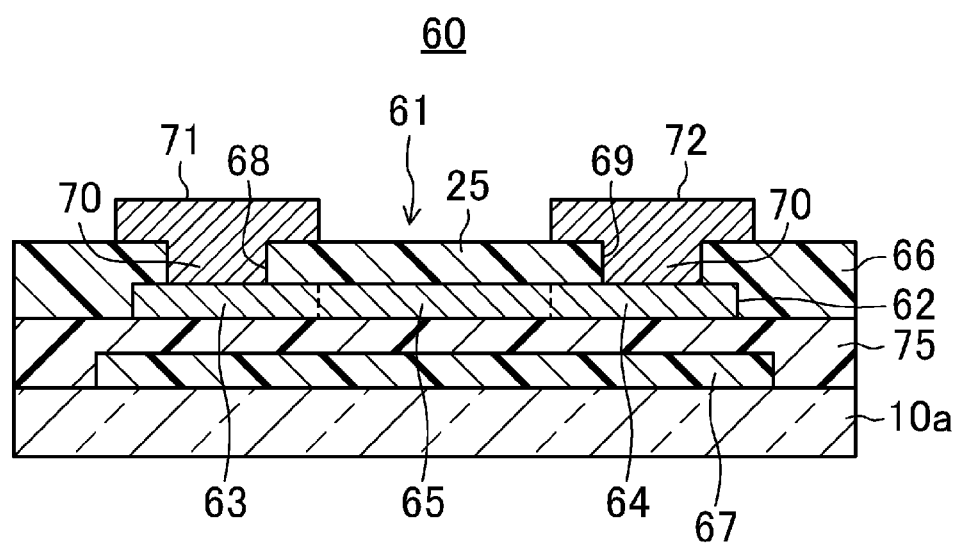
FIG. 24 is a cross-sectional view of a thin film transistor substrate according to the third embodiment of the present disclosure.

Next, the third embodiment of the present disclosure will be described. FIG. 24 is a cross-sectional view of a thin film transistor substrate according to the third embodiment of the present disclosure. In the present embodiment, like reference characters have been used to designate similar elements in the first embodiment, and explanation thereof is omitted. The general configuration of the liquid crystal display device and a fabrication method thereof are similar to those described in the first embodiment. Thus, detailed explanation thereof is omitted here. In the present embodiment, a photodiode, which is an optical sensor, is illustrated as a semiconductor device, and a display device substrate (i.e., a thin film transistor substrate) having a photodiode is described.

A thin film transistor substrate 60 of the present embodiment includes, in addition to a TFT (not shown), a photodiode 61 which is an optical sensor for each pixel as shown in FIG. 24.

The photodiode 61 is located adjacent to the TFT in each pixel, and is comprised of a semiconductor layer 62. More specifically, the photodiode 61 is a PIN photodiode with a lateral structure having a P type semiconductor layer 63 in which an impurity such as boron is heavily doped, an N type semiconductor layer 64 in which an impurity such as phosphorus is heavily doped, and an I (intrinsic) layer 65 which is a high resistivity region made of an intrinsic semiconductor and is located between the P type semiconductor layer 63 and the N type semiconductor layer 64.

Further, the thin film transistor substrate 60 having the photodiode 61 includes a base coating film 75, the semiconductor layer 62, and an insulating film 66 which are sequentially formed on the insulating substrate 10a.

More specifically, as shown in FIG. 24, the thin film transistor substrate 60 includes the base coating film 75 formed on the surface of the insulating substrate 10a, the semiconductor layer 62 formed on the surface of the base coating film 75, and the insulating film 66 formed on the surface of the base coating film 75 so as to cover the semiconductor layer 62.

The thin film transistor substrate 60 further includes a light shielding film 67 provided on the surface of the insulating substrate 10a and located under the semiconductor layer 62. The base coating film 75 is layered on the insulating substrate 10a so as to cover the light shielding film 67.

As shown in FIG. 24, the insulating film 66 is provided with a contact hole 68 through which part of the P type semiconductor layer 63 of the semiconductor layer 62 is exposed, and a contact hole 69 through which part of the N type semiconductor layer 64 of the semiconductor layer 62 is exposed. The contact holes 68, 69 are simultaneously formed by etching, and each of the contact holes 68, 69 is filled with a conductive member 70.

As shown in FIG. 24, an anode electrode 71 and a cathode electrode 72 are formed on the surface of the insulating film 66. The anode electrode 71 is electrically connected to the P type semiconductor layer 63 of the semiconductor layer 62 via the contact hole 68. The cathode electrode 72 is electrically connected to the N type semiconductor layer 64 of the semiconductor layer 62 via the contact hole 69.

The photodiode 61 is used, for example, for detecting the presence or absence, or shades of an object (e.g., a piece of paper, a finger, a pen, etc.) which is placed on the counter substrate 30. More specifically, for example, if light emitted from a light source of the backlight unit, which is provided on the back side of the liquid crystal display device 50, is reflected on the object mentioned above, and the reflected light (e.g., infrared light which is invisible) comes into the photodiode 61, a light leakage current which corresponds to the magnitude of the reflected light having come into the photodiode 61 flows in the photodiode 61, and based on the light leakage current, the presence or absence, or shades of the object is detected.

A material which comprises the base coating film 75 includes, for example, silicon oxide, silicon nitride, silicon oxynitride, etc. The base coating film 75 may have a multilayer structure of these materials. The thickness of the base coating film 75 is preferably from 50 to 300 nm.

The semiconductor layer 62 is made of a polysilicon film. The polysilicon film which comprises the semiconductor layer 62 has a polycrystalline structure obtained by irradiating a silicon film, such as an amorphous silicon film, with laser light. The thickness of the semiconductor layer 62 is preferably from 20 to 100 nm.

A material which comprises the insulating film 66 is not specifically limited, and can be made of, for example, silicon oxide ($SiO_2$), a material having a lower dielectric constant than silicon oxide, such as SiOF or SiOC, silicon nitride (SiNx (where x represents a positive number)) such as trisilicon tetranitride ($Si_3N_4$), silicon oxynitride (SiNO), titanium dioxide ($TiO_2$), dialuminum trioxide ($Al_2O_3$), tantalum oxide such as tantalum pentoxide ($Ta_2O_5$), hafnium dioxide ($HfO_2$), a material having a higher dielectric constant than silicon oxide, such as zirconium dioxide ($ZrO_2$). The insulating film 66 may have a single layer structure, or may have a multilayer structure. The thickness of the insulating film 66 is preferably from 30 to 150 nm.

A material which comprises the conductive member 70 preferably has a high melting point. For example, the conductive member 70 is preferably made of a metal having a high melting point, such as molybdenum (Mo), tantalum (Ta), tungsten (W) and titanium (Ti), or silicide having a high melting point, such as molybdenum silicide.

The light shielding film 67 is configured to prevent light (light emitted from the light source of the backlight unit) from coming into the photodiode 61, and allows only the light reflected on the object, described above, to come into the photodiode 61.

A material which comprises the light shielding film 67 is not specifically limited. For example, the light shielding film 67 is preferably made of a metal having a high melting point, such as molybdenum (Mo), tantalum (Ta), tungsten (W) and titanium (Ti), an alloy material of the metal having a high melting point, or a compound material. The thickness of the light shielding film 67 is preferably from 50 to 300 nm.

In the present embodiment, as well, similar to the case of the first embodiment, the channel protection layer 25 described in the first embodiment is provided in the channel region of the semiconductor layer 62 (i.e., on the surface of the I layer 65) as shown in FIG. 24.

Thus, light having a specific wavelength (especially, visible light, i.e., light having a wavelength of 380 nm to 750 nm, which induces degradation of the photodiode 61) can be effectively reflected, and it is possible to prevent light having a specific wavelength which induces degradation of the semiconductor layer 62 from coming into the I layer 65 of the semiconductor layer 62.

The present embodiment described above can obtain the following advantages in addition to the advantages (3) to (4) described above.

(9) In the present embodiment, the channel protection layer 25 is made of a multilayer film in which the first insulating films 25a and the second insulating films 25b are alternately layered. Further, the relationship between the refractive index Ra of the first insulating film 25a and the refractive index Rb of the second insulating film 25b is Rb/Ra≥1.3. Thus, visible light which induces degradation of the photodiode 61 can be effectively reflected on the channel protection layer 25, thereby making it possible to prevent light having a specific wavelength which induces degradation of the semiconductor layer 62 from coming into the I layer 65 of the semiconductor layer 62. Thus, it is possible to prevent a reduction in properties of the photodiode 61 due to light irradiation of the I layer 65 of the semiconductor layer 62.

(10) Since the channel protection layer 25 is made of a multilayer film in which the first and second insulating films 25a, 25b are layered, properties of the photodiode 61 are not affected by the channel protection layer 25, and light irradiation of the I layer 65 can be effectively reduced, unlike the conventional technique in which a metal layer made of a conductive metal material is provided for blocking light.

The above embodiment may be changed as follows.

The channel protection layer 25 described in the first embodiment is provided in the third embodiment, but the channel protection layer 25 may be replaced with the channel protection layer 33 having the fine projection/recess structure 32 described in the second embodiment. In this case, too, advantages similar to the above advantages (5) to (8) can be obtained.

Industrial Applicability

The present disclosure may be used in a display device substrate, a method for fabricating the display device substrate, and a display device.

Description of Reference Characters 5a thin film transistor
10a insulating substrate
11aa gate electrode
12 gate insulating film
13a semiconductor layer
16aa source electrode
16b drain electrode
17 interlayer insulating film
19a pixel electrode
20a thin film transistor substrate (display device substrate)
25 channel protection layer
25a first insulating film
25b second insulating film
30 counter substrate (second display device substrate)
32 fine projection/recess structure
33 channel protection layer
33a surface of channel protection layer which faces opposite the semiconductor layer
34 recess
36 projection
40 liquid crystal layer (display medium layer)
50 liquid crystal display device
60 thin film transistor substrate (display device substrate)
61 photodiode
62 semiconductor layer
63 P type semiconductor layer
64 N type semiconductor layer
65 I layer
C channel region
H height of projection, or depth of recess
P distance between adjacent projections, or adjacent recesses of projection/recess structure
Ra refractive index of first insulating film
Rb refractive index of second insulating film

The invention claimed is:

1. A display device substrate, comprising:
an insulating substrate;
a gate electrode provided directly on the insulation substrate;
a gate insulating film provided directly on the insulating substrate and the gate electrode;
a semiconductor layer provided on the insulating substrate, directly provided on the gate insulating film, and including a channel region; and
a channel protection layer provided in the channel region and made of an insulating material, wherein
a fine projection/recess structure including recesses and projections is defined in a surface of the channel protection layer which faces away from the semiconductor layer.

2. The display device substrate of claim 1, wherein
a distance between adjacent ones of the projections or adjacent ones of the recesses of the projection/recess structure is 380 nm or less.

3. The display device substrate of claim 1, wherein
a height of the projection or a depth of the recess is 760 nm or more.

4. The display device substrate of claim 1, wherein
the semiconductor layer is a semiconductor layer of a thin film transistor.

5. The display device substrate of claim 1, wherein
the semiconductor layer defines an optical sensor.

6. A display device, comprising:
the display device substrate of claim 1;
a second display device substrate located to face the display device substrate; and
a display medium layer provided between the display device substrate and the second display device substrate.

7. The display device of claim 6, wherein
the display medium layer is a liquid crystal layer.

* * * * *